United States Patent [19]

Vernon

[11] Patent Number: 5,268,327
[45] Date of Patent: Dec. 7, 1993

[54] EPITAXIAL COMPOSITIONS

[75] Inventor: Stanley M. Vernon, Wellesley, Mass.

[73] Assignee: Advanced Energy Fund Limited Partnership, Peterborough, N.H.

[21] Appl. No.: 885,515

[22] Filed: May 19, 1992

Related U.S. Application Data

[60] Division of Ser. No. 772,597, Oct. 7, 1991, abandoned, which is a continuation of Ser. No. 483,339, Feb. 20, 1990, abandoned, which is a continuation of Ser. No. 132,629, Dec. 10, 1987, abandoned, which is a continuation of Ser. No. 806,044, Dec. 6, 1985, abandoned, which is a division of Ser. No. 604,835, Apr. 27, 1984, Pat. No. 4,588,451.

[51] Int. Cl.⁵ .......................................... H01L 21/20
[52] U.S. Cl. ..................... 437/126; 437/126; 437/132; 156/610; 156/613
[58] Field of Search .................. 437/126, 132, 107; 156/610, 613

[56] References Cited

U.S. PATENT DOCUMENTS

| 3,488,542 | 1/1970 | Lehrer et al. | 257/94 |
| 3,541,678 | 11/1970 | McDonald | 437/132 |
| 3,575,628 | 4/1971 | Word | |
| 4,588,451 | 5/1986 | Vernon | 437/126 |

OTHER PUBLICATIONS

Manasevilt, "Recollections and Reflections of MOCVD", Jr-Cyrl. Growth, 55 (1981), 1-9.

Primary Examiner—Robert Kunemund
Assistant Examiner—Ramamohan Rao Paladugu
Attorney, Agent, or Firm—Hayes, Soloway, Hennessey & Hage

[57] ABSTRACT

A method for manufacturing, by chemical depostion from the vapor phase, epitaxial composites comprising thin films of a Group III-V compound semiconductor such as gallium arsenide (GaAs) or gallium alluminum arsenide (GaAlAs) on single crystal silicon substrates.

12 Claims, 2 Drawing Sheets

EPITAXIAL COMPOSITIONS

This is a divisional of copending application Ser. No. 07/772,597 filed Oct. 7, 1991, now abandoned which is a continuation of Ser. No. 07/483,339, filed Feb. 20, 1990, now abandoned which is a continuation of Ser. No. 07/132,629, filed Dec. 10, 1987 now abandoned, which is a continuation of Ser. No. 06/806,044, filed Dec. 6, 1985, now abandoned which is a division of 06/604,835, filed Apr. 27, 1984, now U.S. Pat. No. 4,588,451.

BACKGROUND OF THE INVENTION

Field of the Invention

The present invention relates to epitaxial composites, and more particularly to composites comprising thin films of a Group III-V compound semiconductor such as gallium arsenide (GaAs) or gallium aluminum arsenide (GaAlAs) on monocrystal substrates. The invention further relates to a process for manufacturing, by chemical deposition from the vapor phase, epitaxial composites as above described, and to semiconductor devices based on such epitaxial composites. The composites have particular utility for use in making light sensitive solid state solar cells and will be described in connection with such utility; however, it will be understood that the epitaxial composites may be used in a variety of microelectronic applications.

BACKGROUND OF THE INVENTION

It is well known that solar energy may be converted into other useful forms of energy by using proper techniques. For example, solar energy may be converted into electrical energy by light sensitive solid state solar cells. At the current state of the art, a principal obstacle to wide scale adoption of solar cells is that manufacturing and installation costs of solar cell collector installations generally are substantially higher than the cost of conventional electrical generating installations. In the case of solar cell energy collector installations, the cost of manufacturing the solar cells per se currently is the single largest cost factor in a solar cell energy collection installation. Thus, any technique which increases the overall efficiency of a solar cell, or which reduces the cost of manufacturing a solar cell may have significant commercial importance.

Currently, the most common solar cells are made of single crystal silicon (Si), but cells made of other materials, e.g. cadmium telluride (CdTe) and gallium arsenide (GaAs) have also been developed and tested. Solar cells made of single crystal gallium arsenide in particular offer the prospect of a number of advantages over silicon solar cells. For one, the emf of a gallium arsenide solar cell is substantially higher than that of a silicon solar cell. For single-junction cells the highest theoretical AM1 efficiencies are for energy gaps between 1.45 and 1.5 eV, for which values of about 27.5% at an operating temperature of 27° C. can be expected. Efficiencies of 21-22% at AM1 have been reported for gallium arsenide, which has a bandgap ($E_g$) about 1.43 eV. For silicon —$E_g$=1.1 eV— the calculated conversion efficiency at 27° C. is about 23% at AM1, and silicon cells have reportedly achieved an efficiency of only about 18% under ideal operating conditions.

Secondly, conversion efficiencies of silicon solar cells tend to decrease sharply as the temperature rises, whereas conversion efficiencies of solar cells made of gallium arsenide is adversely affected to a substantially lesser extent by changes in temperature.

While single crystal gallium arsenide solar cells potentially offer higher photovoltaic and conversion efficiencies than single crystal silicon solar cells, single crystal gallium arsenide solar cells typically require expensive single crystal gallium arsenide substrates. It accordingly has been proposed to deposit thin film single crystal gallium arsenide on a single crystal foreign substrate as a means for reducing the cost of manufacturing a gallium arsenide solar cell.

In the past several techniques have been used to deposit single crystal gallium arsenide onto a substrate. One prior art technique, known as the "chloride process", comprises decomposing, in the presence of the substrate, a gaseous mixture constituted by a chloride of an element of Group III and an element of Group V or one of its volatile compositions. A principal drawback of such a process is the necessity of tightly controlled operating conditions which, typically, require the use of a reaction apparatus having three separate zones, each heated to a different, closely controlled temperature. By way of example, for depositing single crystal gallium arsenide from the vapor phase onto a single crystal substrate, bulk, high-purity (device grade) gallium arsenide is placed in a first region or zone of a horizontal reaction chamber and heated to a temperature of about 775° C. A chlorine source gas then is introduced into the reaction chamber, and reacts with vaporized gallium to form gallium trichloride ($GaCl_3$). The resulting gallium trichloride is mixed with arsine ($AsH_3$) in a second central region or zone of the reaction chamber which is maintained at a temperature of about 850° C. The resulting mixture is then passed over a substrate situated in a third region or zone of the chamber which is maintained at a temperature of about 750° C. The trichloride and arsine each dissociate and combine to form an epitaxial gallium arsenide film on the substrate. A further and significant drawback of the chlorine process results from the fact that the operation of the process must take place in the presence of chlorine and/or hydrochloric acid which are themselves capable of attacking the substrate or even the deposit itself while it is in the course of being formed.

Another prior art technique which requires the use of a multi-zone reaction chamber involves presynthesis of a mixture of gallium arsenide in liquid gallium. The presynthesis is achieved in a first region or zone of a horizontal reaction chamber by exposing liquid gallium to arsenic trichloride at the temperature of about 850° C. By maintaining an arsenic vapor pressure in excess of the decomposition pressure of the gallium arsenide-in-gallium solution, a gallium arsenide skin forms on the liquid gallium. The resulting skin serves as the source of gallium arsenide for deposition onto a substrate located in a second region or zone of the reaction chamber and heated to a temperature (700° C. to 750° C.) lower than the temperature (800° C. to 850° C.) of the gallium arsenide-in-gallium source. A significant drawback of this latter process is the requirement that gallium metal be used as a source material in the deposition chamber, since the gallium metal may react with the walls of the deposition chamber at the temperatures involved, and the resultant reaction products may vaporize in the chamber and contaminate the deposited gallium arsenide film.

The foregoing prior art vapor phase gallium arsenide growth techniques also suffer from another drawback in that they all require the use of multi-zone reaction chambers in which two or more regions or zones of the chamber are heated to different, closely controlled, temperatures. Such multiple temperature control requirements are difficult to achieve in a production facility.

Moreover, a heteroepitaxial composite comprising a continuous film of single crystal gallium arsenide (GaAs), or an alloy thereof such as gallium aluminum arsenide (GaAlAs) grown from the vapor phase on a monocrystalline silicon substrate reportedly has not been reproducably achieved in the prior art.

The foregoing discussion of background of the art of vapor phase single crystal gallium arsenide growth techniques is taken largely from Manasevit U.S. Pat. No. 4,404,265, which proposed to solve the aforesaid prior art problems by epitaxially depositing single crystal semiconductor material such as gallium arsenide, gallium aluminum arsenide, or the like on a single crystal electrically insulating substrate such as sapphire, spinel, thorium oxide, gadolinium gallium garnet, BeO and chrysoberyl, by heating the single crystal substrate in a reaction chamber, and introducing into the heated reaction chamber a mixture of arsine, phosphine and/or stibine, and a Group III alkyl compound such as trimethylgallium or triethylgallium. There is no disclosure or suggestion, however, in the Manasevit U.S. patent that his technique advantageously could be employed to epitaxially deposit single crystal gallium arsenide or single crystal gallium aluminum arsenide onto a single crystal silicon substrate.

Another prior art technique for growing thin film single crystal gallium arsenide films on single crystal silicon substrate requires the provision of a thin germanium (Ge) layer between the silicon substrate and the gallium arsenide monocrystal deposition. The prior art considered the germanium layer necessary as a lattice-matching layer. The thin germanium layer may also be considered useful to protect the silicon substrate from attack by the chlorine and/or hydrochloric acid produced in the deposition chamber. However, the requirement for the germanium layer adds to production costs, inasmuch as germanium itself is as costly as gallium arsenide. Moreover its deposition constitutes an additional process step. Furthermore, germanium has a smaller band gap than silicon, and as applied to solar cells is undesirable since the germanium layer will absorb much of the light falling on the cell.

It is thus an object of the present invention to overcome the foregoing and other disadvantages of the prior art. Another object of the present invention is to provide a novel and improved method of forming an epitaxial composite comprising single crystal gallium arsenide or gallium aluminum arsenide on single crystal silicon. Yet another object is to provide novel and low cost solar cells characterized by high photovoltaic conversion efficiencies.

SUMMARY OF THE INVENTION

In accordance with a preferred embodiment of the present invention, there is provided an epitaxial composite comprising a thin film of single crystal semi-conductor material selected from gallium arsenide (GaAs) and gallium aluminum arsenide (GaAlAs) on a single crystal silicon substrate. The invention also provides a method of epitaxially growing a thin film of single crystal semi-conductor compound as above-described on single crystal silicon substrate by means of a novel metal organic chemical vapor deposition procedure which preconditions the silicon surface for GaAs or GaAlAs epitaxial deposition. The invention in another aspect provides improved semi-conductor devices incorporating the epitaxial composites as above-described.

BRIEF DESCRIPTION OF THE FIGURES

Yet other objects as set forth are rendered obvious by the following detailed description of the invention which should be considered together with the accompanying drawings wherein like numbers refer to like parts, and.

DETAILED DESCRIPTION OF THE PREFERRED EMBODIMENTS

Figure 1:
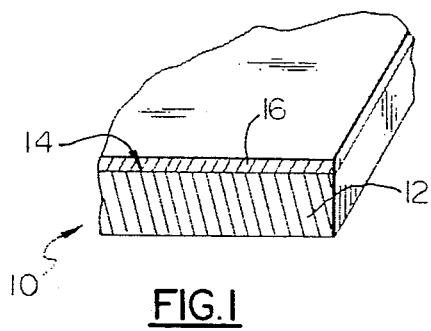
FIG. 1 is a greatly enlarged, fragmentary perspective view, in partial section, of an epitaxial composite in accordance with a preferred embodiment of the present invention.

Referring now to the drawings, and more particularly to FIG. 1, there is shown an epitaxial composite 10 in accordance with the present invention. Composite 10 comprises a substrate 12 of single crystal silicon substrate material. Disposed atop surface 14 of silicon substrate 12 is a thin film 16 of a single crystal gallium Group V material selected from gallium arsenide (GaAs) and gallium aluminum arsenide ($Ga_{1-y}Al_yAs$). (In the foregoing formula y represents a value between 0 and 1.) Thin film 16 also may be a multi-layer structure of gallium arsenide and gallium aluminum arsenide, or a multi-layer structure of gallium arsenide or gallium aluminum arsenide disposed on surface 14 and having disposed thereon another compatible semi-conductor material. Thin film 16 also may comprise layer(s) of n-type doped and p-type doped gallium arsenide and/or gallium aluminum arsenide. Composite 10, the crystallographic characteristics of which are discussed hereinbelow, is produced in accordance with the inventive vapor phase deposition process now described.

Figure 2:
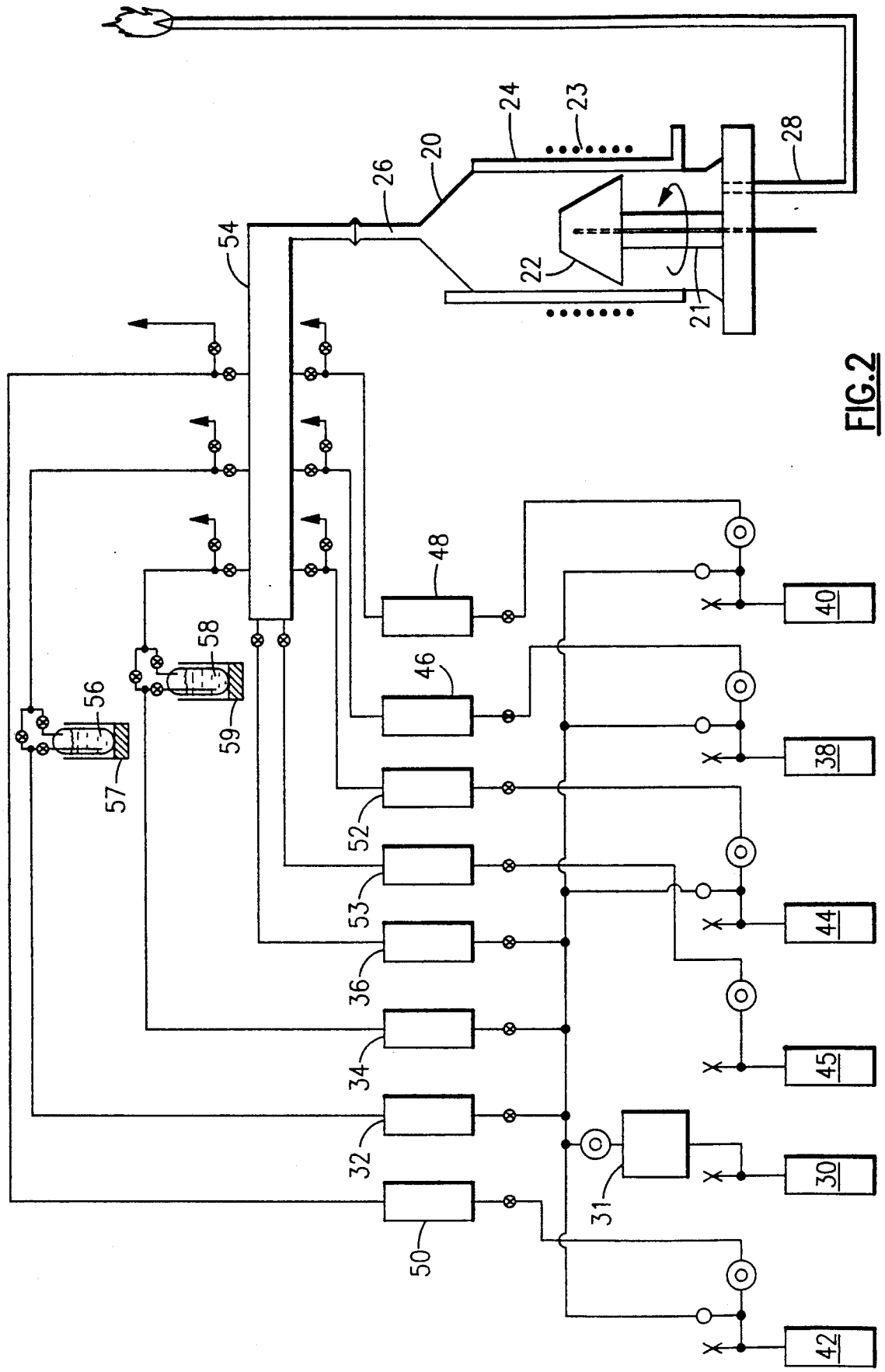
FIG. 2 is a simplified schematic diagram of an apparatus for illustrating the inventive process for producing an epitaxial composite in accordance with the present invention.

Referring now to FIG. 2, there is shown an apparatus useful for epitaxially depositing thin film single crystal gallium arsenide and/or gallium aluminum arsenide directly onto single crystal silicon. The apparatus comprises a Model SPI-MO CVD 450 Reactor available from Spire Corporation, Bedford, Mass. As shown in FIG. 2, the apparatus includes a vertical reactor vessel 20 formed of quartz, and provided with a quartz support rod 21 and a rotating susceptor 22, the latter formed of a material such as carbon covered by a film of silicon carbide, which can be inductively heated, e.g. using an RF heating coil 23. Reactor vessel 20 is provided with an inlet 26 and an outlet 28, the latter being connected to an appropriate gas exhaust. A water filled cooling jacket 24 surrounds reactor vessel 20 in part. A carrier gas, typically hydrogen ($H_2$), from a first supply tank 30 may be flowed through reactor vessel 20, through mass flow controllers 32, 34 and 36 which measure and control the flow of carrier gas as will be described herein below. The hydrogen supply 30 may be a gas cylinder or, for convenience and economy, a bulk cryogenic source. The hydrogen gas from supply 30 may, furthermore, be passed through a palladium purifier 31 or other such means for purifying the gas in order to insure the exclusion of contaminants.

The apparatus shown in FIG. 2 further comprises a second supply tank 38 for containing arsine ($AsH_3$) in hydrogen gas, a third supply tank 40 for containing hydrogen selenide ($H_2Se$) in hydrogen gas, a fourth supply tank 42 for containing dimethylzinc in hydrogen gas, a fifth supply tank 44 for containing a supply of hydrogen chloride (HC1) gas for cleaning the reactor vessel between production runs, and a sixth supply tank 45 for containing nitrogen ($N_2$). Supply tanks 38, 40, 42, 44 and 45 are connected via mass flow controllers 46, 48, 50, 52 and 53, respectively, to a manifold or mixing chamber 54, which manifold in turn is connected to inlet 26 of reactor vessel 20.

Completing the apparatus as shown in FIG. 2 is a first cylinder package, commonly called a bubbler, 56 for containing a supply of trimethylgallium (TMGa), and a second cylinder package or bubbler 58 for containing a supply of trimethylaluminum (TMA1). The bubblers 56 and 58 and the liquid compounds contained therein are maintained at constant low temperature by cooling baths 57 and 59, respectively. Each bubbler contains an interior dip tube for bubbling a predetermined flow of hydrogen gas through the liquid TMGa or TMA1, as the case may be. Except as above mentioned, the entire apparatus is formed of stainless steel or the like.

WORKING EXAMPLES

The following examples, illustrative of principles of the present invention, based on the epitaxial deposition of single crystal gallium arsenide and/or gallium aluminum arsenide on a single crystal silicon wafer oriented 3° off {100} towards {110}. The overall procedure involved the use of the apparatus as shown in FIG. 2 under conditions as described.

EXAMPLE I

As an illustrative example of the present invention, the following procedure was used to produce an epitaxial thin film of single crystal gallium arsenide on two inch diameter single crystal silicon wafers.

The silicon wafers were subjected to solvent cleaning in trichloroethylene followed by acetone followed by methanol. The silicon wafers were then water rinsed using deionized water and were then subjected to an HF dip for 30 seconds at 25° C. Following the HF dip, the silicon wafers were water rinsed using deionized water and blown dry using a jet of filtered nitrogen gas. The dried wafers were immediately loaded into the reactor vessel 20, where they were placed on the surface of the rotating susceptor 22. The reactor vessel 20 was then sealed and flushed thoroughly with nitrogen gas by opening mass flow controller 53 for 3 minutes with a flow of 5 liters per minute. The nitrogen flow was then terminated by closing mass flow controller 53, and hydrogen gas was introduced into the reactor vessel 20 by opening mass flow controller 36; the hydrogen flow was typically maintained at 5 liters per minute for the remainder of the deposition process. The reactor vessel 20 was flushed with hydrogen gas for 15 minutes.

The silicon wafers were then heated to a temperature of about 620° C. by means of RF induction coil 23 which couples to the rotating susceptor 22 upon which the wafers rest. The temperature of the interior wall of reactor vessel 20 was maintained at a low value on the order of or less than 100° C. by means of a flow of chilled water through water jacket 24; under conditions of typical operation, the cooling water had an inlet temperature of 5° C. and flowed at about 2 gallons per minute, sufficient to abstract on the order of seven kilowatts of energy from the system.

Next, mass flow controller 46 was opened to permit a controlled flow of arsine from supply tank 38 to vent, bypassing reactor vessel 20. After approximately one minute of flowing to permit stabilization, the arsine flow was diverted from vent into reactor vessel 20 via manifold 54. The flow rate of arsine was selected to give a specific excess of arsine over that stochiometrically required for reaction (I) given below. Typically, with arsine concentration in supply tank 38 of about 10 percent in hydrogen, a flow rate of about 50 cc per minute of the arsine/hydrogen mixture, or about 5 cc per minute of pure arsine, through mass flow controller 46, is appropriate for deposition.

Next, mass flow controller 32 was opened and the hydrogen carrier gas permitted to flow through bubbler 56, thereby becoming saturated with trimethylgallium vapor. After approximately one minute of flowing to vent to permit stabilization, the flow of hydrogen gas saturated with trimethylgallium was diverted to reactor vessel 20 via manifold 54. The flow rate for hydrogen gas through bubbler 56, as measured by mass flow controller 32, was maintained at between about 3 cc per minute to about 11 cc per minute, typically about 6 cc per minute so as to pick up sufficient trimethylgallium to provide an arsine-to-gallium mole ratio (As-Ga ratio) in the range of about 5:1 to about 10:1 throughout the growth process.

The diversion of the flow through bubbler 56 from vent to the reactor vessel 20 was performed in such a manner as to develop an appreciable back-pressure in the alkyl (trimethylgallium) line. As a consequence of this back-pressure, the introduction of the trimethylgallium-saturated hydrogen into reactor vessel 20 induced an instantaneous arsine-to-gallium ratio significantly lower than 5:1. This transient in the arsine-to-gallium ratio was believed to precondition the silicon surface for GaAs epitaxial deposition. That the diversion of flow through bubbler 56 in a manner to develop a transient in the arsine-to-gallium ratio is responsible for the unique consequences achieved is quite clear, inasmuch as introduction of the arsine and gallium compounds under other conditions failed to provide comparable results.

The trimethylgallium supplied from bubbler 56 reacts with the arsine supplied from tank 38 to produce single crystal gallium arsenide, in situ, atop heated substrate 12. Although the decomposition temperature of gallium arsenide at one atmospheric pressure is about 550° C., a temperature below that of heated substrate 12, the gallium arsenide monocrystal film formed on substrate 12 did not decompose due to the excess arsine present in reactor vessel 20. Gallium arsenide single crystal film (3 micron thick) was formed at a growth rate of about 0.06 micron per minute.

While a free radical mechanism can be written to explain the formation of gallium arsenide from trimethylgallium and arsine, it is also possible that the controlling reaction is the following:

$$(CH_3)_3Ga + AsH_3 \rightarrow GaAs + 3CH_4 \quad (I)$$

From this equation (I), the stoichiometric amount of arsine required to produce gallium arsenide from a given amount of trimethylgallium may be calculated.

Figure 3:
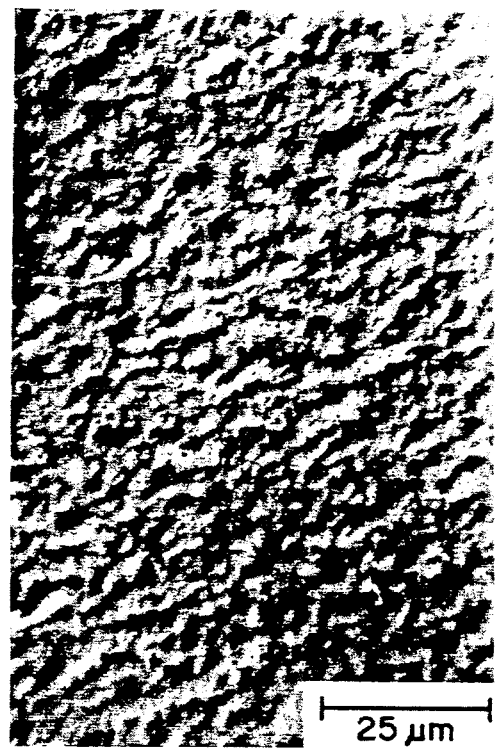
FIG. 3 is a photomicrograph showing the surface characteristics of a thin film of single crystal gallium arsenide prepared in accordance with the present invention on a single crystal silicon substrate.

FIG. 3 is a photomicrograph showing the surface microstructure of a gallium arsenide film epitaxially grown on monocrystalline silicon in accordance with the process conditions as above described. The gallium arsenide film is tightly adhered to the substrate and is mirror-smooth to the unaided eye. Analysis by x-ray diffraction using Cu-K radiation revealed a narrow, well-resolved 400 peak indicating the monocrystallinity of the gallium arsenide layer. The absence of any polycrystalline regions within the film has been confirmed by TEM (transmission electron microscope) analysis.

EXAMPLE II

The procedure of Example I was repeated with trimethylaluminum also being introduced into the reactor vessel in the process described in Example I. Two-inch diameter single-crystal silicon wafers were subjected to solvent cleaning in trichlorethylene followed by acetone followed by methanol. The silicon wafers were then water rinsed using deionized water and were then subjected to an HF dip for 30 seconds at 25° C. Following the HF dip, the silicon wafers were water rinsed using deionized water and blown dry using a jet of filtered nitrogen gas. The dried wafers were immediately loaded into the reactor vessel 20, where they were placed on the surface of the rotating susceptor 22. The reactor vessel 20 was then sealed and flushed thoroughly with nitrogen gas by opening mass flow controller 53 for 3 minutes with a flow of 5 liters per minute. The nitrogen flow was then terminated by closing mass flow controller 53, and hydrogen gas was introduced into the reactor vessel 20 by opening mass flow controller 36; the hydrogen flow was typically maintained at 5 liters per minute for the remainder of the deposition process. The reactor vessel 20 was flushed with hydrogen gas for 15 minutes. The silicon wafers were then heated to a temperature of about 620° C. by means of RF induction coil 23 which couples to the rotating susceptor 22 upon which the wafers rest. The temperature of the interior wall of reactor vessel 20 was maintained at a low value on the order of or less than 100° C. by means of a flow of chilled water through water jacket 24; under conditions of typical operation, the cooling water had an inlet temperature of 5° C. and flowed at about 2 gallons per minute, sufficient to abstract on the order of seven kilowatts of energy from the system.

Next, mass flow controller 46 was opened to permit a controlled flow of arsine in hydrogen gas to vent, as before. Next, mass flow controllers 32 and 34 were opened to permit the flow of hydrogen gas through bubblers 56 and 58, respectively, whereby to become saturated with trimethylgallium and trimethylaluminum, respectively. The flow rates of hydrogen gas through bubblers 56 and 58 were adjusted to pickup sufficient trimethylgallium and trimethylaluminum, respectively, to provide the desired gallium-to-aluminum mole ratio (Ga-Al ratio) of about 9:1, and an arsine-to-gallium plus aluminum combined mole ratio (As-Ga+Al ratio) in the range of about 5:1 to 10:1. As described in Example I, the diversion of the combined flows through bubblers 56 and 58 from vent to the reactor vessel 20 was performed in such a manner as to develop an appreciable back-pressure in the alkyl line. As a consequence of this back-pressure, the introduction of the trimethylgallium- and trimethylaluminum-saturated hydrogen gas into reactor vessel 20 induced an instantaneous arsine-to-gallium+aluminum ratio significantly lower than 5:1; this transient in the ratio preconditioned the silicon surface for gallium aluminum arsenide epitaxial deposition.

The trimethylgallium supplied from bubbler 56 and trimethylaluminum supplied from bubbler 58 react with the arsine supplied from tank 38 to deposit a smooth, 3 micron thick film of gallium aluminum arsenide alloy ($Ga_{0.9}Al_{0.1}As$) tightly adhered to the silicon wafers. The resulting composite was examined as before and found to be substantially free of polycrystalline regions within the film. Thus, the composition of the film deposit may be varied from consisting essentially of gallium arsenide, to gallium-rich gallium aluminum arsenide alloy, to 50:50 gallium aluminum arsenide alloy, to aluminum-rich gallium aluminum arsenide alloy.

If desired, the gallium arsenide or gallium aluminum arsenide epitaxial film may be doped during formation. To accomplish this, a controlled amount of an appropriate acceptor or donor dopant is introduced into the gas phase in reactor vessel 20 during film deposition. By way of example, if n-type semiconductor film is desired, a controlled amount of selenium (Se), for example, may be introduced into the process in the form of $H_2Se$ from container 40 via mass flow controller 48. In the reactor vessel 20, the elevated temperature causes dissociation of the $H_2Se$ to provide a (Se) dopant for the thin film, and hydrogen gas. Alternatively, sulfur, for example, in the form of $H_2S$ may be employed. If p-type semiconductor film is desired, a suitable material such as dimethylzinc $(CH_3)_2Zn$ may be introduced during film formation, in controlled amount, from supply 42 via mass flow controller 50. Dissociation of the dimethylzinc at the elevated temperatures in reactor vessel 20 provides a (zinc) dopant and an organic by-product which is exhausted from the system via the hydrogen carrier gas flow. Alternatively, diethylzinc $(C_2H_5)_2Zn$ or dimethylcadmium $(CH_3)_2Cd$ may be employed for forming p-type semiconductor film.

A particular feature and advantage of the present invention, which results from epitaxially growing gallium arsenide and gallium aluminum arsenide single crystal semiconductor material directly onto single crystal silicon substrates, i.e. without an intervening layer of germanium as in the prior art, is the ability to produce high efficiency two-bandgap photovoltaic cells. The addition of a thin-film cell of single crystal gallium arsenide or gallium aluminum arsenide on the silicon substrate converts a conventional single-bandgap silicon cell, which may have a typical efficiency of from about twelve to about fifteen percent, to a two-bandgap cell with a potential conversion efficiency of from about twenty-five up to about thirty percent. While the superimposition of the gallium arsenide or gallium aluminum arsenide thin-film cell atop an active silicon solar-cell substrate increases cell fabrication cost, the increased cell efficiency more than makes up for the added fabrication cost.

Figure 4:
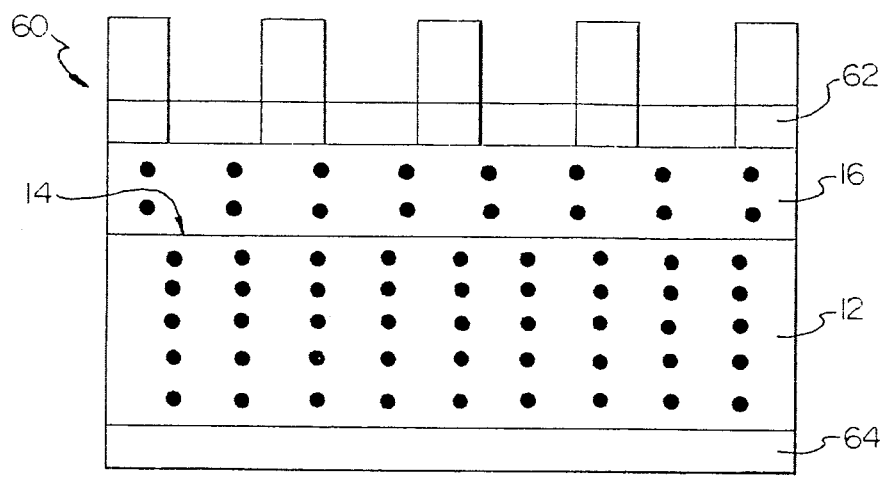
FIG. 4 is a side elevational view, in cross-section, of a solar cell made in accordance with the present invention.

Referring to FIG. 4, the resulting gallium arsenide/silicon and gallium aluminum arsenide/silicon composites made in accordance with the present invention atop active silicon solar-cell substrates may be fabricated into a solar cell 60 by suitable doping of the gallium arsenide or gallium aluminum arsenide films, and application of metal electrodes 62, 64 on the top and bottom surfaces of the composites in known manner (see for example U.S. Pat. Nos. 3,686,036, 3,589,946, 3,811,954 and 3,844,843). The resulting solar cell also may be provided with an anti-reflection coating, and the cell may be encapsulated using techniques and materials which are well-known in the art.

While the present invention has been described with particular utility in the formation of solar cells on silicon substrates, one skilled in the art will recognize that the process of the present invention and the resultant composite structures may be advantageously employed for providing semiconductor materials for a variety of microelectronic devices including diodes, transistors and integrated circuits which are given as exemplary.

From the foregoing discussion, it will be apparent that numerous variations, modifications and substitutions will now appear to those skilled in the art, all of which fall within the spirit and scope contemplated by the present invention. For example, triethylgallium may be employed as the gallium source in place of trimethylgallium. Still other modifications will be obvious to one skilled in the art. Accordingly, the invention is intended to be limited only by the scope of the appended claims.

I claim:

1. A method of forming a composite comprising a single crystal silicon substrate and a single crystal film consisting of gallium arsenide or gallium aluminum arsenide disposed on said silicon substrate, said method comprising the steps of:

heating said substrate in a reactor vessel and introducing into said heated reactor vessel a mixture in the vapor phase of arsine and an organometallic compound of gallium or of arsine and a mixture of organometallic compounds of gallium and aluminum, in a carrier gas;

epitaxially depositing on and in direct contact with said silicon surface a single crystal film of gallium arsenide or gallium aluminum arsenide under conditions which produce an initial transient unbalance in the gallium-arsenic vapor ratio towards a more gallium rich vapor; and continuing said depositing to produce a single film deposit of gallium arsenide or gallium aluminum arsenide.

2. A method according to claim 1, wherein said crystal film is deposited under conditions which produce a transient preconditioning of the silicon surface for gallium arsenide or gallium aluminum arsenide epitaxial deposition.

3. A method according to claim 1, wherein said single crystal film is deposited initially from an arsine-to-gallium or arsine-to-gallium-plus-aluminum instantaneous vapor ratio value significantly lower than 5:1, and thereafter being deposited at a ratio of at least about 5:1.

4. A method according to claim 1, and employing hydrogen as the carrier gas.

5. A method according to claim 1, including the step of sweeping said reactor vessel with said carrier gas prior to introducing said mixture into said heated reactor vessel.

6. A method according to claim 1, including the step of pretreating said silicon substrate with an HF solution prior to introducing said substrate into said reactor vessel.

7. A method according to claim 1, including the step of maintaining the silicon substrate and the walls of said reactor vessel at substantially different temperatures during said deposition.

8. A method according to claim 7, wherein said reactor walls are maintained at substantially cooler temperature than said silicon substrate.

9. A method according to claim 1, wherein said organometallic compound is selected from the group consisting of trimethylgallium, triethylgallium, trimethylaluminum and mixtures thereof.

10. A method according to claim 1, wherein the temperature of said silicon substrate is maintained at about 620° during said deposition.

11. A method according to claim 1, and including the step of introducing a donor dopant into the vapor phase mixture during said single crystal film deposition.

12. A method according to claim 1, wherein said dopant is selected from the group consisting of selenium, zinc and cadmium.

* * * * *